United States Patent
Moriya et al.

(10) Patent No.: US 11,024,528 B2
(45) Date of Patent: Jun. 1, 2021

(54) ELECTROSTATIC CHUCK DEVICE HAVING FOCUS RING

(71) Applicant: SUMITOMO OSAKA CEMENT CO., LTD., Tokyo (JP)

(72) Inventors: Yoshiaki Moriya, Tokyo (JP); Keigo Maki, Tokyo (JP); Hitoshi Kouno, Tokyo (JP); Kazuto Ando, Tokyo (JP); Yuuki Kinpara, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 373 days.

(21) Appl. No.: 15/769,672

(22) PCT Filed: Oct. 21, 2016

(86) PCT No.: PCT/JP2016/081262
§ 371 (c)(1),
(2) Date: Apr. 19, 2018

(87) PCT Pub. No.: WO2017/069238
PCT Pub. Date: Apr. 27, 2017

(65) Prior Publication Data
US 2018/0308737 A1    Oct. 25, 2018

(30) Foreign Application Priority Data
Oct. 21, 2015   (JP) .............................. JP2015-207060

(51) Int. Cl.
*H01L 21/683* (2006.01)
*H01L 21/687* (2006.01)
*H01L 21/67* (2006.01)

(52) U.S. Cl.
CPC .... *H01L 21/6833* (2013.01); *H01L 21/67069* (2013.01); *H01L 21/67109* (2013.01);
(Continued)

(58) Field of Classification Search
CPC ................ H01H 59/0009; H02N 13/00; H01L 21/6831; H01L 21/6833; H01L 21/67069;
(Continued)

(56) References Cited

U.S. PATENT DOCUMENTS

2004/0261946 A1*  12/2004  Endoh ............... H01J 37/32082
                                                       156/345.15
2006/0087793 A1*   4/2006  Kim ...................... H01J 37/321
                                                       361/234
(Continued)

FOREIGN PATENT DOCUMENTS

JP     2004-214312 A    7/2004
JP     2005-064460 A    3/2005
(Continued)

OTHER PUBLICATIONS

International Search Report for PCT/JP2016/081262 (dated Jan. 10, 2017).

*Primary Examiner* — Gustavo A Rosario-Benitez
(74) *Attorney, Agent, or Firm* — Merchant & Gould P.C.

(57) ABSTRACT

An electrostatic chuck device comprising: a placing table having a placing surface on which a plate-shaped sample is placed, an electrostatic attraction electrode, which is located on a lower side of the placing table in such a manner that the electrode is located on a surface side opposite to the placing surface of the placing table, a base part on which at least the placing table and the electrostatic attraction electrode are mounted, a focus ring which surrounds the placing table wherein the focus ring is a continuous ring or is divided into two or more portions, and a lift pin which is movable in an up-down direction and raises the entirety of or at least a part of the focus ring from the base part.

17 Claims, 2 Drawing Sheets

(52) U.S. Cl.
CPC ...... *H01L 21/6831* (2013.01); *H01L 21/6875* (2013.01); *H01L 21/68735* (2013.01); *H01L 21/68742* (2013.01)

(58) Field of Classification Search
CPC ......... H01L 21/67109; H01L 21/68735; H01L 21/68742; H01L 21/6875
See application file for complete search history.

(56) References Cited

U.S. PATENT DOCUMENTS

| | | | |
|---|---|---|---|
| 2007/0031609 A1 | 2/2007 | Kumar et al. | |
| 2008/0099450 A1* | 5/2008 | Lewington | H01J 37/32091 219/121.58 |
| 2010/0039747 A1* | 2/2010 | Sansoni | H01L 21/6831 361/234 |
| 2014/0254061 A1* | 9/2014 | Shiraiwa | H01L 21/6831 361/234 |
| 2014/0311676 A1* | 10/2014 | Hatoh | H01L 21/3065 156/345.51 |
| 2015/0332951 A1* | 11/2015 | Male | H01L 21/68785 361/234 |

FOREIGN PATENT DOCUMENTS

| | | |
|---|---|---|
| JP | 2007-084919 A | 4/2007 |
| WO | 2014/025637 A1 | 2/2014 |

* cited by examiner

ELECTROSTATIC CHUCK DEVICE HAVING FOCUS RING

TECHNICAL FIELD

This application is a National Stage Application under 35 U.S.C. 071 of International Application No. PCT/JP2016/081262 filed Oct. 21, 2016, which claims the benefit of priority to Japanese Patent Application No. 2015-207060 filed on Oct. 21, 2015, the disclosures of all of which are hereby incorporated by reference in their entireties. The International Application was published in Japanese on Apr. 27, 2017 as WO 2017/069238.

BACKGROUND

In the past, in a semiconductor manufacturing apparatus, an electrostatic chuck device using an electrostatic attraction mechanism has been used as a device for simply mounting and fixing a plate-shaped sample such as a wafer or a glass substrate to a placing table. Such an electrostatic chuck device is provided with a lift pin which penetrates the placing table in a vertical direction and can move up and down (for example, Patent Literature No. 1). In such an electrostatic chuck device, the plate-shaped sample can be easily separated from the placing table by the lift pin.

CITATION LIST

Patent Literature

[Patent Literature No. 1] Japanese Laid-open Patent Publication No. 2004-214312

SUMMARY OF INVENTION

Technical Problem

In the electrostatic chuck device provided with the lift pin, a hole into which the lift pin is inserted is provided in the surface of the placing table. Due to this hole, the temperature distribution of the surface of the placing table tends to become non-uniform. The surface temperature of the placing table affects an etching rate when performing plasma etching of the plate-shaped sample. For this reason, there is a possibility that the non-uniformity of the surface temperature which is caused by the hole may impede homogeneous etching.

The present invention has been made in view of such circumstances and has an object to provide an electrostatic chuck device having a structure in which a plate-shaped sample can be easily separated from a placing table without impeding the uniformity of the surface temperature of the placing table.

Solution to Problem

In order to solve the above problem, the following device is provided as a first aspect of the present invention.

The present invention provides an electrostatic chuck device including: a placing table part having a placing surface on which a plate-shaped sample is placed on the upper side; an electrostatic attraction electrode which is located on the lower side of the placing table part; a base part on which the placing table part is mounted; a focus ring which surrounds the placing table part; and a lift pin which raises the focus ring with respect to the base part.

More specifically, a first aspect of the present invention provides an electrostatic chuck device including: a placing table having a placing surface on which a plate-shaped sample is placed; an electrostatic attraction electrode, which is located on a lower side of the placing table in such a manner that the electrode is located on a surface side opposite to the placing surface of the placing table; a base part on which at least the placing table and the electrostatic attraction electrode are mounted; a focus ring which surrounds the placing table wherein the focus ring is a continuous ring or is divided into two or more portions; and a lift pin which is movable in an up-down direction and raises the entirety of or at least a part of the focus ring from the base part.

In the electrostatic chuck device according to the first aspect, it is preferable that the focus ring has an annular shape in a plan view and has a movable portion and a fixed portion, which are divided from each other, wherein the movable portion is moved up or down according to a movement of the lift pin, and the fixed portion is fixed to the base part.

In the electrostatic chuck device according to the first aspect, it is preferable that the movable portion and the fixed portion divided from each other are divided in a circumferential direction. That is, it is preferable that the movable portion and the fixed portion are divided such that slopes overlapping in the up-down direction are formed over the circumferential direction.

In the electrostatic chuck device according to the first aspect, it is preferable that the movable portion has a first surface which is facing downward at an end portion thereof in the circumferential direction, and the fixed portion has a second surface which is facing upward at an end portion thereof in the circumferential direction, and wherein the first surface and the second surface face each other in the up-down direction.

In the electrostatic chuck device according to the first aspect, it is preferable that the first surface and the second surface are inclined to have an angle in which an acute angle which is formed by each of the surfaces and a horizontal plane is 45° or less with respect to a horizontal direction.

In the electrostatic chuck device according to the first aspect, it is preferable that the focus ring has a mounting surface, which is configured to mount and move the plate-shaped sample according to a rise of the focus ring which is caused by the lift pin, and the mounting surface of the focus ring is located at a height which is equal to or lower than a height of the placing surface on which the plate-shaped sample is mounted, before the plate-shaped sample is mounted.

In the electrostatic chuck device according to the first aspect, it is preferable that the placing table has a peripheral portion integrated with the placing table and provided over an outer peripheral edge of the placing table, an upper surface of the peripheral portion has a pair of embankment portions and a groove portion which is formed between the embankment portions and is used as a gas flow path, the focus ring has an upper-side portion and a lower-side portion which are divided from each other in the up-down direction, the upper-side portion is movable in up and down directions by the lift pin, and the lower-side portion is fixed to the peripheral portion and covers the groove portion which forms a gas flow path and is located on the lower side of the lower-side portion.

In the electrostatic chuck device according to the first aspect, it is preferable that the focus ring is disposed to have a portion, which overlaps the electrostatic attraction electrode in a plan view, and is attracted by the electrostatic attraction electrode.

In the electrostatic chuck device according to the first aspect, it is also preferable that the focus ring is vertically divided into an upper-side portion and a lower-side portion, an upper surface of the upper-side portion is divided into two portions, which are a movable portion and a fixed portion, by two straight lines reaching the center of the ring, the device includes an annular peripheral portion integrated with the placing table, the peripheral portion mounts the focus ring and has a hole in which the lift pin is inserted, the lift pin inserted in the hole of the peripheral portion is connected to the movable portion of the focus ring, and an upper surface of the focus ring is located at a height equal to or lower than a height of the placing surface of the placing table when viewed in a cross section, at times other than lift work.

In the electrostatic chuck device according to the first aspect, it is also preferable that the peripheral portion has a pair of embankment portions facing each other and extending along the circumferential direction and a groove portion surrounded by the embankment portions, the groove portion has a cooling gas introduction hole, and the focus ring is cooled with a cooling gas flowing through the groove portion.

In the electrostatic chuck device according to the first aspect, it is also preferable that at least one of a lower surface of the upper-side portion and an upper surface of the lower-side portion has a groove portion, the lower-side portion has a cooling gas introduction hole which introduces a cooling gas into the groove portion, and the introduced cooling gas cools the focus ring.

In the electrostatic chuck device according to the first aspect, it is also preferable that an annular protrusion portion is provided on the focus ring, wherein the annular protrusion portion has the same outer diameter as an outer diameter of the focus ring and a larger inner diameter than an inner diameter of the focus ring, and a height of an upper surface of the protrusion portion approximately coincides with a height of an upper surface of the plate-shaped sample.

In the present invention, these preferred features can also be used in combination with each other as long as there is no particular problem.

Advantageous Effects of Invention

According to the present invention, it is possible to provide an electrostatic chuck device having a structure in which a plate-shaped sample can be easily separated from a placing table without impeding the uniformity of the surface temperature of the placing table.

DESCRIPTION OF EMBODIMENTS

Figure 1:
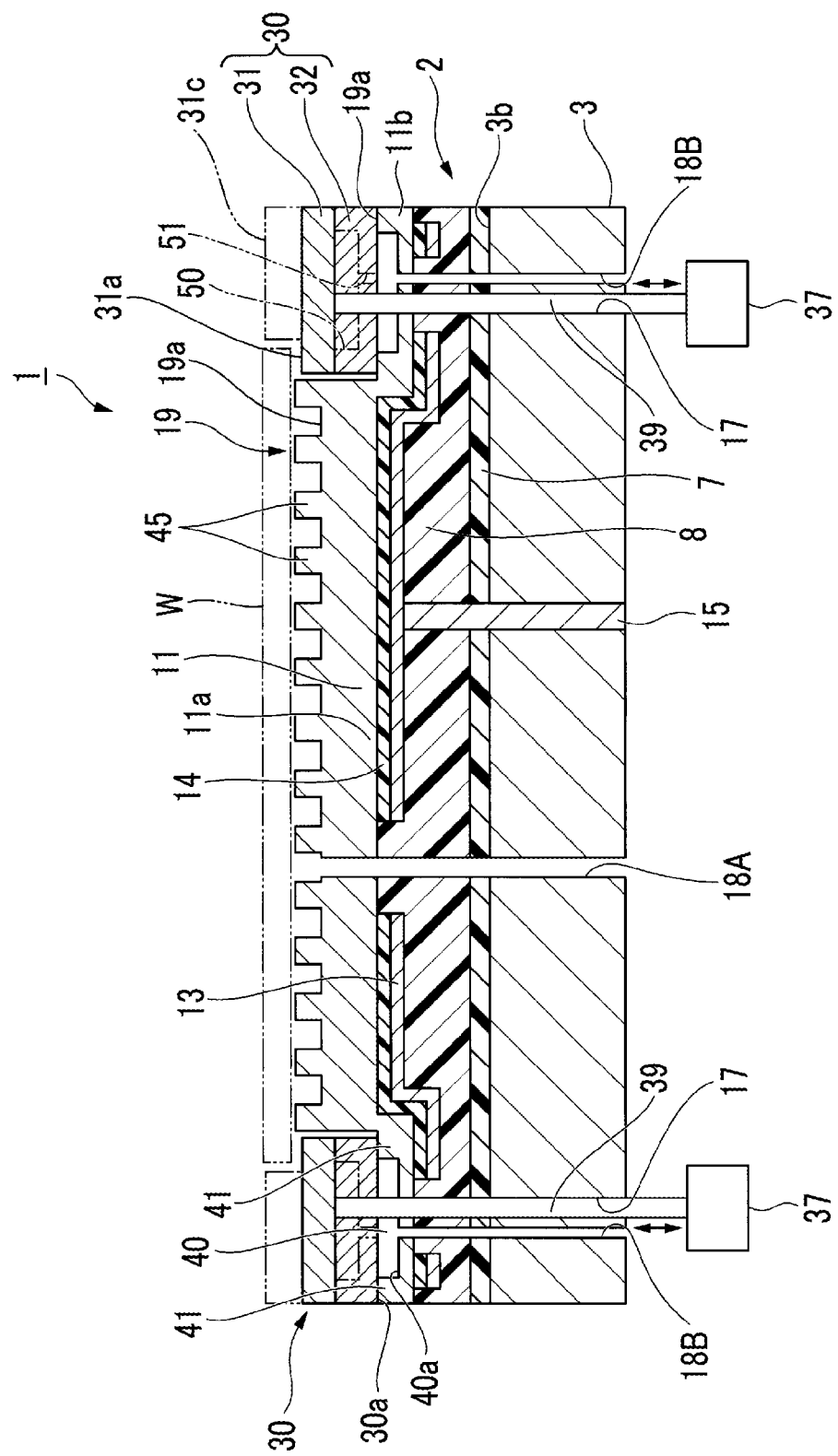
FIG. 1 is a schematic sectional view of an electrostatic chuck device according to a first embodiment, showing a preferred example of the present invention.

Hereinafter, an electrostatic chuck device 1 according to an embodiment, which is a preferred example of the present invention, will be described with reference to the drawings. In the drawings which are used in the following description, in order to make the features easy to understand, there is a case where characteristic portions are shown in an enlarged manner for convenience, and the dimensional ratio of each constituent element is not necessarily the same as the actual value.

Further, the present invention is not limited to only these examples, and additions, omissions, or substitutions of configurations, a change in position, number, or shape, and other modifications can be made within a scope which does not depart from the gist of the present invention. The present invention is not limited by the description which will be described later, and is limited only by the scope of the appended claims.

Figure 2A:
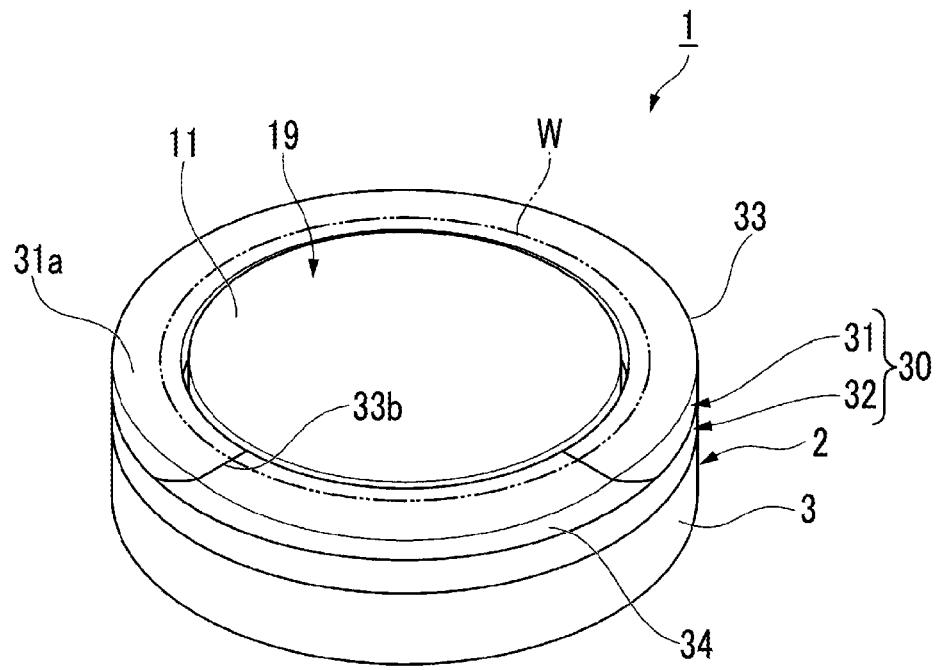
FIG. 2A is a schematic perspective view showing that the electrostatic chuck device according to the first embodiment is in a steady state.
Figure 2B:
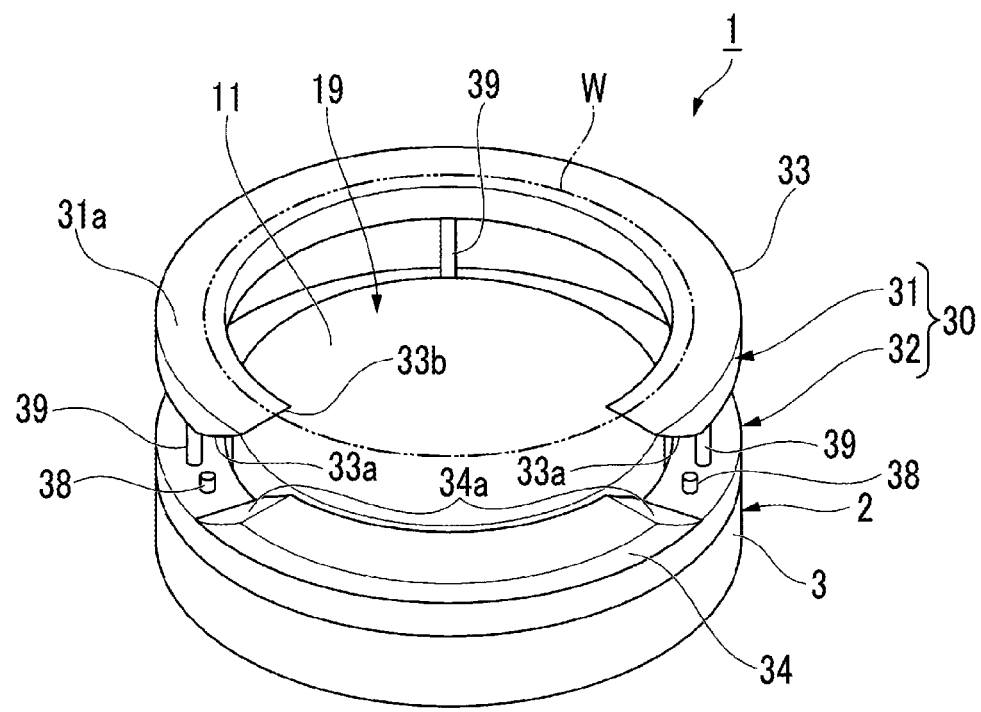
FIG. 2B is a schematic perspective view showing that the electrostatic chuck device according to the first embodiment is in a lift state.

FIG. 1 is a sectional view of the electrostatic chuck device 1 showing a preferred example of the present invention. FIGS. 2A and 2B are perspective views of the electrostatic chuck device 1. The electrostatic chuck device 1 of FIG. 2A is in a steady state where a plate-shaped sample W is fixed to a placing plate 11. The electrostatic chuck device 1 of FIG. 2B is in a lift state for separating the plate-shaped sample W such as a silicon wafer. In these drawings, the plate-shaped sample W that is larger than a placing surface is placed. In this specification, the steady state of the electrostatic chuck device 1 means a state where the plate-shaped sample W that is an object to be processed is attracted to the device and a mounting surface 31a is at a low position. On the other hand, the lift state of the electrostatic chuck device 1 means a state where the plate-shaped sample W is lifted up and separated from a placing surface 19 of the placing plate 11 in order to move the plate-shaped sample W to processing which is performed in the next step.

The electrostatic chuck device 1 is provided with the placing surface 19 which has a circular shape when viewed in a plan view and on which the plate-shaped sample W is placed, a main body part 2 having the placing surface 19, an annular focus ring 30 disposed to surround the placing surface 19 of the main body part 2, and a lift pin 39 which lifts the focus ring 30 with respect to the main body part 2. Further, the main body part 2 has the placing plate 11 having the placing surface 19, a first insulating layer 14, an electrostatic attraction electrode 13, an adhesion layer 8, a second insulating layer 7, and a base part (a base material part) 3 in this order. In this specification, the relative position of each configuration will be described with the placing surface 19 side being the upper side of the electrostatic chuck device 1 and the base part 3 side being the lower side of the electrostatic chuck device 1. However, the posture of the electrostatic chuck device 1 at the time of actual use is not limited to this orientation. Further, the "outside (or the outside in a radial direction)" and the "inside (or the inside in a radial direction)" are set on the basis of a radial direction with respect to a central axis extending in an up-down direction of the electrostatic chuck device 1. Further, a circumferential direction around the central axis (a circumference around the central axis) is simply referred to as a "circumferential direction". In this way, the position of each part will be described.

(Main Body Part)

The main body part 2 has a structure in which the placing plate 11, the first insulating layer 14, the electrostatic attraction electrode 13, the adhesion layer 8, the second insulating layer 7, and the base part 3 are stacked in order from the upper side. Further, the main body part 2 has a power supply terminal 15 which penetrates the adhesion layer 8, the second insulating layer 7, and the base part 3 and applies voltage to the electrostatic attraction electrode 13. The placing plate 11 has a disc shape and has a placing table 11a which is located on the center side in the radial direction, and a flange-shaped peripheral portion 11b which is located at a peripheral edge of the main body part and is at a position lowered by one step with respect to the placing table 11a. The peripheral portion 11b has a surface facing upward. In this example, a stepped surface 19a is provided as the surface facing upward. That is, the stepped surface 19a lowered by one step with respect to the placing surface 19 is provided at the periphery of the placing surface 19 of the main body part 2. The focus ring 30 is mounted on the stepped surface 19a. The stepped surface 19a has a step and is preferably provided with a groove portion 40 surrounded by the step or a bottom portion 40a of a groove portion.

Further, the first insulating layer 14 and the electrostatic attraction electrode 13 which are located on the lower side of the placing plate 11 are formed in layers in order on the lower surface side of the placing plate 11. An upper surface 3b of the base part 3 is flat, and the gap between the base part 3 and the electrostatic attraction electrode 13 is filled with the adhesion layer 8.

Holes penetrating the stacked base materials, the insulating layer, the adhesion layer, and the like in a thickness direction, specifically, a first cooling gas introduction hole 18A, a second cooling gas introduction hole 18B, and a lift pin insertion hole 17 are formed in the main body part 2. The first cooling gas introduction hole 18A is open in the placing surface 19. On the other hand, the second cooling gas introduction hole 18B and the lift pin insertion hole 17 are open in the stepped surface 19a.

The electrostatic attraction electrode 13 and the first insulating layer 14 are formed so as to avoid the first cooling gas introduction hole 18A, the second cooling gas introduction hole 18B, and the lift pin insertion hole 17, that is, so as not to come into contact with these holes. That is, the first cooling gas introduction hole 18A, the second cooling gas introduction hole 18B, and the lift pin insertion hole 17 are provided in the electrostatic attraction electrode 13 and the first insulating layer 14 when viewed in a plan view.

It is also preferable that the electrostatic attraction electrode 13 and the first insulating layer 14 are blocked from the outer periphery of the electrostatic chuck device by the adhesion layer 8 and are not exposed to the outside.

A cooling gas such as He, which is selected as necessary, is supplied to the first cooling gas introduction hole 18A and the second cooling gas introduction hole 18B. The cooling gas introduced from the first cooling gas introduction hole 18A flows through a gap between the placing surface 19 and the lower surface of the plate-shaped sample W to cool the plate-shaped sample W. On the other hand, the cooling gas introduced into the second cooling gas introduction hole 18B flows through a gap between the stepped surface 19a and the lower surface of the focus ring 30 to cool the focus ring. The gas flowing through the gap between the stepped surface 19a and the lower surface of the focus ring 30 and having been used for cooling is appropriately discharged as necessary. A plurality of second cooling gas introduction holes may be provided, and any one of these holes may be used for the discharging.

The lift pin 39 is inserted into the lift pin insertion hole 17. A lift pin drive device 37 for synchronously moving the plurality of lift pins 39 up and down is provided at a lower end of the lift pin 39. The lift pin 39 is movable up and down along an inner peripheral portion of the lift pin insertion hole 17. It is preferable that a tubular insulator (not shown) is provided on the inner peripheral portion of the pin insertion hole 28 to secure insulation between the lift pin 39 and the main body part 2.

(Placing Plate)

The placing plate 11 has the placing table 11a having the placing surface 19 on which the plate-shaped sample W is placed, on the upper side, and the peripheral portion 11b provided at the peripheral edge of the placing table 11a. The peripheral portion 11b is formed at the outer peripheral edge of the placing plate 11 over the whole circumference in the circumferential direction. The upper surface of the peripheral portion 11b is the stepped surface 19a which is lowered by one step with respect to the placing surface 19 and on which the focus ring 30 is mounted.

A plurality of projection portions 45 each having a diameter smaller than the thickness of the plate-shaped sample W are formed on the placing surface 19 of the placing table 11a. The electrostatic chuck device 1 has a configuration in which the plurality of projection portions 45 support the plate-shaped sample W. In this way, it is possible to cool the plate-shaped sample W by forming a flow path for the cooling gas on the lower side of the plate-shaped sample W. The projection portion 45 has an approximately truncated cone shape. The shape of the projection portion 45 is not limited to the truncated cone shape. Further, the cross-sectional shape of the projection portion 45 is not limited to a circular shape and may be a rectangular shape or a triangular shape. The height of the projection portion 45 can be arbitrarily selected. However, the projection portion 45 is preferably formed at a height of 6 µm or more and 50 µm or less, more preferably, 6 µm or more and 20 µm or less, for the purpose of enhancing the flow efficiency of the cooling gas. The plurality of projection portions 45 are provided to be spaced apart from each other. The plurality of projection portions 45 are provided over the entire area of the placing surface 19 when the electrostatic chuck device 1 is viewed in a plan view. The interval between the projection portions is not particularly limited.

It is preferable that a pair of annular embankment portions 41 facing each other and extending along the circumferential direction and the annular groove portion (gas flow path) 40 formed between the pair of embankment portions 41 are provided on the stepped surface 19a of the peripheral portion 11b. The focus ring 30 is mounted on the upper end surfaces of the pair of embankment portions 41.

The lift pin insertion hole 17 is open in the groove portion 40, and the lift pin 39 passes through the hole in the up-down direction. Further, the second cooling gas introduction hole 18B is open in the groove portion 40, and the cooling gas is introduced through the second cooling gas introduction hole 18B. With this configuration, the cooling gas flows into the groove portion 40, and thus the groove portion 40 becomes a gas flow path. The cooling gas flows through the groove portion 40, whereby the focus ring 30 is cooled.

It is favorable if the depth of the groove portion 40 is a depth to the extent that does not impede the flow of the cooling gas for cooling the focus ring 30 in the groove portion 40. The depth is preferably in a range of 10 µm to 50 µm, more preferably, 35 µm to 40 µm, further preferably, 13 µm to 15 µm, and most preferably, 10 µm to 12 µm.

The placing plate 11 can be formed of a material which is arbitrarily selected, and is preferably made of an insulating ceramic sintered compact which is selected from an aluminum oxide-silicon carbide ($Al_2O_3$—SiC) compound sintered compact, an aluminum oxide ($Al_2O_3$) sintered compact, an aluminum nitride (AlN) sintered compact, an yttrium oxide ($Y_2O_3$) sintered compact, and the like. These materials have mechanical strength and durability against corrosive gas and plasma thereof.

The average particle diameter of the ceramic particles in the ceramic sintered compact is preferably 10 µm or less, and more preferably 2 µm or less. The manufacturing process of the placing plate 11 includes sandblasting or the like, which is performed in a step of forming the projection portions 45 which are provided on the placing surface 19. The sandblasting step is a step of blowing abrasives onto the surface of the placing surface 19 to excavate the surface. For this reason, there is a case where cracks remain in the projection portion 45.

The remaining cracks are forcibly removed in advance by buffing which is performed after the sandblasting step.

The cracks are formed at the grain boundaries of the ceramic particles in the ceramic sintered compact. Therefore, in a case where the particle diameter of the ceramic particle is large, corner portions are greatly removed along the grain boundaries by undergoing the buffing. The larger the particle diameter of the ceramic particle is, the more rounded the shape of the projection portion 45 is. As will be described later, it is preferable that the projection portion 45 of this embodiment does not have a change in cross-sectional area in a height direction. Therefore, it is preferable that the projection portion 45 is not rounded. By setting the average particle diameter of the ceramic particles to be 10 µm or less (more preferably, 2 µm or less), it is possible to form the projection portion 45, in which a change in cross-sectional area in the height direction is suppressed, on the placing surface 19.

The thickness of the placing plate 11 can be arbitrarily selected. However, it is preferable that the thickness of the placing plate 11 is 0.3 mm or more and 1.0 mm or less. If the thickness of the placing plate 11 is 0.3 mm or more, there is no possibility that an electric discharge may occur due to breakage of the insulation of the placing plate 11 by the voltage applied to the electrostatic attraction electrode 13. Further, if the thickness of the placing plate 11 is 0.3 mm or more, there is no possibility that breakage and cracking may occur during processing. On the other hand, if the thickness of the placing plate 11 is 1.0 mm or less, it is possible to sufficiently attract and fix the plate-shaped sample W with a desired strength. The size of the placing surface of the placing plate 11 is smaller than the size (dimensions) of the plate-shaped sample W, and the size of the circle which is formed by the inner periphery of the focus ring is smaller than the size of the plate-shaped sample W.

(First Insulating Layer)

The first insulating layer 14 is a resin layer having insulation properties and voltage resistance. As a material for forming the first insulating layer 14, polyimide resin, silicone resin, epoxy resin, or the like can be given as an example. The first insulating layer 14 can be formed by any method. However, it is preferable that the first insulating layer 14 is formed by bonding a film-shaped or sheet-shaped forming material. The first insulating layer 14 is bonded to the lower surface of the placing plate 11 through an adhesive (not shown). A line between the first insulating layer 14 and the placing plate 11 may be considered as the adhesive.

(Electrostatic Attraction Electrode)

The electrostatic attraction electrode 13 is located under the placing table 11a and the peripheral portion 11b of the placing plate 11. The electrostatic attraction electrode 13 is used as an electrostatic chuck electrode for generating electric charges and fixing the plate-shaped sample W with an electrostatic attraction force. The shape or size thereof is appropriately adjusted according to the use thereof. For example, the electrostatic attraction electrode 13 may be provided as an electrode having a predetermined pattern in a layer where the electrostatic attraction electrode 13 is formed. The electrostatic attraction electrode 13 functions even if it is provided as a so-called solid electrode without a pattern.

The electrostatic attraction electrode 13 can also be formed by bonding nonmagnetic metal foil which is a material for forming the electrostatic attraction electrode 13 to the first insulating layer 14, or by forming a film on the first insulating layer 14 by sputtering or vapor deposition. In addition, the electrostatic attraction electrode 13 may be formed by applying a compound material of a conductive material which is a material for forming the electrostatic attraction electrode 13 and an organic material by a coating method such as screen printing. Further, the electrostatic attraction electrode 13 may be installed in the interior of the placing plate 11.

The electrostatic attraction electrode 13 may be formed of any material. For example, electrostatic attraction electrode 13 can be formed of conductive ceramics such as an aluminum oxide-tantalum carbide ($Al_2O_3$—$Ta_4C_5$) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, an aluminum nitride-tantalum (AlN—Ta) conductive compound sintered compact, or an yttrium oxide-molybdenum ($Y_2O_3$—Mo) conductive compound sintered compact, high melting point metal such as tungsten (W), tantalum (Ta), or molybdenum (Mo), or the like. Further, the electrostatic attraction electrode 13 can also be formed of copper (Cu), aluminum (Al), or carbon (C).

The thickness of the electrostatic attraction electrode 13 is not particularly limited. For example, it is preferable that the thickness is 0.1 µm or more and 50 µm or less. If the thickness is 0.1 µm or more, sufficient electric conductivity can be secured. On the other hand, if the thickness is 50 µm or less, cracking due to a difference in coefficient of thermal expansion between the electrostatic attraction electrode 13 and the placing plate 11 does not occur in the joint interface between the electrostatic attraction electrode 13 and the placing plate 11.

The electrostatic attraction electrode 13 may have the same size as the first insulating layer 14 when viewed in a plan view. Alternatively, the electrostatic attraction electrode 13 may have a configuration in which it is smaller than the first insulating layer 14 when viewed in a plan view. The electrostatic attraction electrode 13 is configured in this manner, whereby the first insulating layer 14 is also present obliquely upward toward the outside of the device from an end portion of the electrostatic attraction electrode 13. For this reason, by providing the first insulating layer 14 not only vertically above the electrostatic attraction electrode 13 but also obliquely above the electrostatic attraction electrode 13, it is possible to obtain the effect of improving withstand voltage, and thus it is possible to suppress dielectric breakdown.

(Power Supply Terminal)

The power supply terminal 15 is a rod-shaped terminal provided in order to apply a direct-current voltage to the electrostatic attraction electrode 13. A material for forming the power supply terminal 15 is not particularly limited as long as it is a conductive material having excellent heat resistance. For example, a metal material or a conductive organic material can be used. The electric conductivity of the power supply terminal 15 is preferably $10^4$ Ω·cm or less.

It is preferable that the power supply terminal 15 has a coefficient of thermal expansion close to the coefficient of thermal expansion of the electrostatic attraction electrode 13. For example, conductive ceramic configuring the electrostatic attraction electrode 13 or a metal material such as tungsten (W), tantalum (Ta), molybdenum (Mo), niobium (Nb), or a Kovar alloy is suitably used. It is preferable that the power supply terminal 15 is surrounded by an insulator (not shown) having insulation properties to be insulated from the base part 3.

(Base Part)

The base part 3 is disposed on the side opposite to the placing plate 11 side of the electrostatic attraction electrode 13 (below the electrostatic attraction electrode 13). The placing table 11a is mounted on the base part 3. The base part 3 cools the placing plate 11 to adjust the temperature of the placing plate 11 to a desired temperature. The base part 3 has a thick disc shape. The shape of the base part 3 can be arbitrarily selected, and for example, a water-cooled base part or the like, in which a flow path (not shown) for circulating water is formed in the interior thereof, can be suitably used.

The material constituting the base part 3 is not particularly limited as long as it is metal having excellent thermal conductivity, electric conductivity, and workability, or a compound material containing the metal, and can be selected as necessary. For example, aluminum (Al), an aluminum alloy, copper (Cu), a copper alloy, stainless steel (SUS), titanium, or the like is suitably used. It is preferable that at least the surface which is exposed to plasma, of the base part 3, is subjected to alumite treatment or has an insulating film such as alumina formed thereon.

(Second Insulating Layer)

The second insulating layer 7 is preferably a film-shaped or sheet-shaped resin having insulation properties and voltage resistance and is provided between the base part 3 and the electrostatic attraction electrode 13. In this embodiment, the second insulating layer 7 is bonded to the upper surface of the base part 3 through an adhesive (not shown). The second insulating layer 7 can have the same configuration (forming material and thickness) as that of the first insulating layer 14 described above. A line between the second insulating layer 7 and the base part 3 may be considered as the adhesive.

(Adhesion Layer)

The adhesion layer 8 is interposed between the lower surface of the placing plate 11 and the upper surface of the base part 3, covers the side surfaces of the first insulating layer 14, the electrostatic attraction electrode 13, and the second insulating layer 7, and integrates the respective layers of the main body part 2.

Further, the adhesion layer 8 has an action of relieving thermal stress.

The adhesion layer 8 can be formed of any material and is formed of, for example, a cured body obtained by heating and curing a silicone resin composition, or acrylic resin. It is preferable that the adhesion layer 8 is formed by filling a fluid resin composition between the placing plate 11 and the base part 3 and then heating and curing the resin composition.

(Focus Ring)

The focus ring 30 is mounted on the upwardly facing surface of the peripheral portion 11b of the placing plate 11, in this example, on the stepped surface 19a. The focus ring 30 covers the groove portion (gas flow path) 40 of the stepped surface 19a which is located on the lower side thereof.

In this embodiment, the electrostatic attraction electrode 13 extends to a position overlapping the focus ring 30 when viewed in a plan view. In this way, the electrostatic attraction electrode 13 electrostatically attracts the focus ring. That is, the focus ring 30 is electrostatically attracted to the peripheral portion 11b of the placing plate 11.

The focus ring 30 surrounds the placing table 11a. The focus ring 30 has an annular shape when viewed in a plan view. The inner diameter of the focus ring 30 is slightly larger than the outer diameter of the placing table 11a.

It is preferable that the focus ring 30 is controlled so as to have the same temperature as that of the plate-shaped sample W in a processing step such as plasma etching. The material of the focus ring 30 is arbitrarily selected. However, for example, in a case of being used in oxide film etching, a sintered compact such as polycrystalline silicon or silicon carbide is suitably used.

As shown in FIG. 1, the focus ring 30 has an upper-side portion 31 and a lower-side portion 32 which are divided from each other in the up-down direction and can be separated from each other. Each of the upper-side portion 31 and the lower-side portion 32 has an annular shape.

The lower-side portion 32 covers the groove portion (gas flow path) 40 of the stepped surface 19a which is located on the lower side thereof. The cooling gas which is introduced into the groove portion 40 cools the lower-side portion 32 and also cools the upper-side portion 31 through the lower-side portion 32. The lower-side portion 32 is fixed to the main body part 2 by being electrostatically attracted thereto. An insertion hole 32h (not shown) into which the lift pin 39 is inserted is provided in the lower-side portion 32. The lower-side portion 32 maintains a state of being fixed to the main body part 2 even in a case where the lift pin 39 moves up and down.

The upper-side portion 31 is located on the upper side of the lower-side portion 32. The upper-side portion 31 is fixed to the main body part 2 through the lower-side portion 32 by electrostatic attraction. An upper end surface of the lift pin 39 is fixed to the lower surface of the upper-side portion 31. In this way, the upper-side portion 31 is separated from the lower-side portion 32 according to a rise of the lift pin 39.

As shown by an imaginary line (a two-dot chain line) in FIG. 1, it is also preferable that a groove portion (a gas flow path) 50 through which the cooling gas flows is provided between the upper-side portion 31 and the lower-side portion 32. A cooling gas introduction hole 51 which is open to the groove portion 50 and penetrates in the up-down direction may be provided in the lower-side portion 32. The cooling gas introduction hole 51 introduces the cooling gas from the groove portion 40 or directly from the second cooling gas introduction hole. The groove portion 50 may be provided on the lower surface of the upper-side portion 31 or may be provided on the upper surface of the lower-side portion 32. The groove portions 50 may be provided in both of them. In these cases, the cooling gas is also introduced between the upper-side portion 31 and the lower-side portion 32, and thus the cooling gas directly cools the upper-side portion 31.

In a case where there is the groove portion 50, the stepped surface 19a may be made as a flat surface with the groove portion 40 omitted. In this case, the second cooling gas introduction hole is connected to the groove portion 50.

The upper-side portion 31 has the mounting surface 31a facing upward. The mounting surface 31a faces the lower surface of the plate-shaped sample W. When the plate-shaped sample W is not lifted, the mounting surface 31a is located at a height equal to or lower than the height of the placing surface 19 of the placing table 11a, that is, a height lower than the placing surface 19. Here, the height of the placing surface 19 means the height at which the plate-shaped sample W is mounted, in the placing surface 19, when viewed in the cross section. That is, in this embodiment, the height of the placing surface 19 means the height of the top of the projection portion 45. These heights may be grasped as the distance from the bottom surface of the base part when viewed in the cross section. The plate-shaped sample W is mounted on the mounting surfaces 31a according to a rise by the lift pin 39.

It is preferable that the surface roughness Ra of the mounting surface 31a is 0.05 μm or less. In this way, the contact between the mounting surface 31a and the plate-shaped sample W becomes smooth, and thus the abrasion of the mounting surface 31a hardly progresses, so that the generation of particles due to the abrasion can be suppressed.

As shown by an imaginary line (a two-dot chain line) in FIG. 1, a protrusion portion 31c extending in the circumferential direction may be further provided on the outer side in the radial direction of the mounting surface 31a. The protrusion portion 31c surrounds the plate-shaped sample W from the outside in the radial direction. The height of the upper surface of the protrusion portion 31c approximately coincides with the height of the upper surface of the plate-shaped sample W. The protrusion portion 31c is provided, whereby the consistency of an electrical environment with respect to plasma is enhanced between the inside and the outside of the plate-shaped sample W when viewed in a plan view. In this way, it is possible to make it more difficult for the difference or bias of plasma processing to occur between the plate-shaped sample W and the outside thereof, and thus it is possible to enhance the homogeneity of etching. The shape of the protrusion portion 31c can be arbitrarily selected. However, it is preferable that the shape is an annular shape. The protrusion portion 31c is disposed on the focus ring, and it is also preferable that the outer diameter of the protrusion portion 31c is the same as that of the focus ring and the inner diameter is larger than that of the focus ring.

As shown in FIG. 2A, the upper-side portion 31 of the focus ring 30 has an annular shape when viewed in a plan view. Further, the upper-side portion 31 of the focus ring 30 preferably has a movable portion 33 and a fixed portion 34 divided from each other in the circumferential direction. In the drawing, the upper-side portion of the focus ring 30 is divided into two portions and has one movable portion and one fixed portion. The upper-side portion of the focus ring 30 may be divided into two or more portions, as necessary.

As shown in FIG. 2B, the movable portion 33 rises according to the rise of the lift pin 39. By this operation, the movable portion 33 can lift the plate-shaped sample. Further, a positioning hole (not shown) which is fitted to a positioning pin 38 provided on the upper surface of the lower-side portion 32 is provided on the lower surface of the movable portion 33. The positioning pin 38 and the positioning hole (not shown) are provided, whereby the movable portion 33 is positioned on the lower-side portion 32 without being displaced when the movable portion 33 is lowered together with the lift pin 39.

On the other hand, the fixed portion 34 is fixed to the lower-side portion 32 (that is, to the base part 3 side).

Therefore, the fixed portion 34 is not separated from the lower-side portion 32 even if the lift pin 39 moves up and down.

A part of the movable portion 33 is open in the radial direction, and thus the movable portion 33 has an opening portion 33b between both ends of the movable portion and forms a C shape when viewed in a plan view. Further, when the movable portion 33 does not move, the fixed portion 34 is located in the opening portion 33b of the movable portion 33 when viewed in a plan view. As shown in FIG. 2A, in the steady state of the electrostatic chuck device 1, the movable portion 33 and the fixed portion 34 are connected in the circumferential direction to form a closed circle. Further, as shown in FIG. 2B, when the electrostatic chuck device 1 is in the lift state, only the movable portion 33 rises, and thus the opening portion 33b of the movable portion 33 is opened.

In the lift state, a transfer claw (not shown) for transferring the plate-shaped sample W can be inserted into the opening portion 33b from the outside in the radial direction.

The movable portion 33 has first surfaces 33a which are inclined surfaces facing downward, at a pair of end portions in the circumferential direction. In this example, each of end lines of the pair of end portions in the circumferential direction, which are on the mounting surface 31a, is on a straight line passing through the center of the annular shape. However, the present invention is not limited thereto.

On the other hand, the fixed portion 34 has second surfaces 34a which are inclined surfaces facing upward, at a pair of end portions in the circumferential direction. In the steady state, the first surface 33a and the second surface 34a overlap each other when viewed in a plan view. The first surface 33a and the second surface 34a face each other with a gap of 5 mm or less interposed therebetween in the up-down direction in the steady state of the electrostatic chuck device 1. The lower limit of the gap can be arbitrarily selected and may be 0.01 mm or the like. Further, the first surface 33a and the second surface 34a may be in contact with each other such that there is no gap, in the steady state. In the steady state, the first surface 33a and the second surface 34a overlap each other in the up-down direction by the each other's oblique surfaces. With this structure, the contact portion between the movable portion 33 and the fixed portion 34, or the gap between these portions is in a state of extending obliquely with respect to the up-down direction. In this way, it is possible to lengthen a passage which is required for infiltration, and thus it is possible to suppress the infiltration of plasma into the gap between the movable portion 33 and the fixed portion 34. Therefore, expansion of the gap due to corrosion of the movable portion 33 and the fixed portion 34 in the gap can be suppressed, and thus the electrostatic chuck device 1 with a long life can be provided. It is preferable that the inclination angle (acute angle) of each of the first surface 33a and the second surface 34a with respect to the horizontal direction is 45° or less. In this way, infiltration of plasma into the gap between the movable portion 33 and the fixed portion 34 can be more effectively suppressed.

The ratio of the surface area of the fixed portion 34 to the surface area of the movable portion 33, that is, the ratio of the areas of the divided mounting surfaces, when viewed in a plan view can be arbitrarily selected. However, for example, 1:1.5 to 1:15, 1:1.5 to 1:5, 1:1.5 to 1:3, or the like can be given as an example.

In this embodiment, the first surface 33a and the second surface 34a are inclined surfaces having a constant gradient. However, there is no limitation to only such a form. For example, each of the first surface 33a and the second surface 34a may be a part of each of stepped surfaces extending in a staircase pattern and facing each other in the up-down direction. Further, the first surface 33a and the second surface 34a may be inclined surfaces in which a gradient changes along the circumferential direction.

The focus ring 30 of this embodiment can also adopt a configuration in which the upper-side portion 31 and the lower-side portion 32 are formed by separate members, or a configuration in which the focus ring 30 does not have the lower-side portion 32.

Similarly, the focus ring 30 can also adopt a configuration in which it does not have the fixed portion 34. That is, the focus ring 30 may have a configuration in which a closed ring-shaped movable portion rises together with a lift pin to lift the plate-shaped sample W. Specifically, the closed ring-shaped movable portion may have a configuration in which the fixed portion 34 in FIG. 2A is integrated with the movable portion 33 and the integrated upper-side portion 31 is used as a movable portion. Alternatively, the integrated upper-side portion 31 and the lower-side portion 32 may be further integrated with each other to be used a movable portion. The fixed portion 34 and the lower-side portion 32 may be integrated with each other.

As described above, the structure according to the present invention provides an excellent effect.

According to the electrostatic chuck device 1 of this embodiment, at least a part of the focus ring 30 surrounding the placing table 11a is raised. In this way, the plate-shaped sample W can be separated from the placing surface 19 of the placing table 11a. Therefore, a lift pin penetrating the placing table 11a is not required.

As a result, it is not necessary to provide a lift pin insertion hole which is open in the placing surface 19 and tends to become a temperature singular point in the placing surface 19, and thus it is possible to enhance the uniformity of the in-plane temperature of the placing surface 19.

According to the electrostatic chuck device 1 of this embodiment, the peripheral edge of the plate-shaped sample W having a circular shape when viewed in a plan view can be supported by the focus ring 30 having an annular shape. Therefore, a large contact area for supporting the plate-shaped sample W can be secured, and thus it is possible not only to reduce a load which is applied to the plate-shaped sample and but also to suppress the generation of particles due to abrasion of the plate-shaped sample W.

Further, in the electrostatic chuck device 1 of this embodiment, the focus ring 30 comes into contact the peripheral edge of the plate-shaped sample W in the lift state. Therefore, for example, in a case where the plate-shaped sample W is a silicon wafer and the electrostatic chuck device 1 is used for manufacturing of a silicon device, or the like, a load is not applied to a device area in the lift state, and thus a manufacturing process having high reliability can be constructed.

According to the electrostatic chuck device 1 of this embodiment, the focus ring 30 has an annular shape when viewed in a plan view and preferably includes the movable portion 33 and the fixed portion 34 divided from each other in the circumferential direction. With such a configuration, the movable portion 33 has the opening portion 33b which is sandwiched between both ends thereof and is open in the radial direction. Therefore, in the movable portion 33, the opening portion 33b is opened in the lift state, and a transfer claw portion (not shown) can be inserted through the opening portion 33b from the outside in the radial direction.

Further, according to the electrostatic chuck device 1 of this embodiment, the focus ring 30 covers the groove portion 40 as a gas flow path provided on the lower side thereof. More specifically, the focus ring 30 has the upper-side portion 31 and the lower-side portion 32, and the groove portion 40 is preferably provided on the lower side of the lower-side portion 32. Further, as a modification example of the electrostatic chuck device 1, the groove portion 50 may be provided between the upper-side portion 31 and the lower-side portion 32. With such a configuration, the focus ring 30 can be effectively cooled by the cooling gas, and the temperature of the outer peripheral portion of the plate-shaped sample W can be stabilized, and thus the etching characteristic in the plane of the plate-shaped sample W can be uniformized.

A preferred embodiment example according to the present invention has been described above with reference to the accompanying drawings. However, it goes without saying that the present invention is not limited to this example. The shapes, combinations, or the like of the constituent members shown in the example described above are merely examples, and various modifications can be made based on design requirements or the like within a scope which does not depart from the gist of the present invention.

INDUSTRIAL APPLICABILITY

It is possible to provide an electrostatic chuck device having a structure in which a plate-shaped sample can be easily separated from a placing table without impeding the uniformity of the surface temperature of the placing table.

REFERENCE SIGNS LIST

1: electrostatic chuck device
2: main body part
3: base part
3b: upper surface
7: second insulating layer
8: adhesion layer
11: placing plate
11a: placing table
11b: peripheral portion
13: electrostatic attraction electrode
14: first insulating layer
15: power supply terminal
17: lift pin insertion hole
18A: first cooling gas introduction hole
18B: second cooling gas introduction hole
19: placing surface
19a: stepped surface
28: pin insertion hole
30: focus ring
31: upper-side portion
31a: mounting surface
31c: protrusion portion
32: lower-side portion
33: movable portion
33a: first surface
33b: opening portion
34: fixed portion
34a: second surface
37: lift pin drive device 37
38: positioning pin
39: lift pin
40, 50: annular groove portion (gas flow path)
40a: bottom portion of groove portion 41: embankment portion
45: projection portion
51: cooling gas introduction hole
W: plate-shaped sample

The invention claimed is:

1. An electrostatic chuck device comprising:
a placing table having a placing surface on which a plate-shaped sample is placed;
an electrostatic attraction electrode, which is located on a lower side of the placing table in such a manner that the electrode is located on a surface side opposite to the placing surface of the placing table;
a base part on which at least the placing table and the electrostatic attraction electrode are mounted;
a focus ring which surrounds the placing table wherein the focus ring is a continuous ring or is divided into two or more portions; and
a lift pin which is movable in an up-down direction and raises the entirety of or at least a part of the focus ring from the base part
wherein the placing table has a peripheral portion integrated with the placing table and provided over an outer peripheral edge of the placing table,
an upper surface of the peripheral portion has a pair of embankment portions and a groove portion which is formed between the embankment portions and is used as a gas flow path,
the focus ring has an upper-side portion and a lower-side portion which are divided from each other in the up-down direction,
the upper-side portion is movable in up and down directions by the lift pin, and
the lower-side portion is fixed to the peripheral portion and covers the groove portion which forms the gas flow path and is located on a lower side of the lower-side portion.

2. The electrostatic chuck device according to claim 1, wherein the focus ring is disposed to have a portion, which overlaps the electrostatic attraction electrode in a plan view, and is attracted by the electrostatic attraction electrode.

3. An electrostatic chuck device comprising:
a placing table having a placing surface on which a plate-shaped sample is placed;
an electrostatic attraction electrode, which is located on a lower side of the placing table in such a manner that the electrode is located on a surface side opposite to the placing surface of the placing table;
a base part on which at least the placing table and the electrostatic attraction electrode are mounted;
a focus ring which surrounds the placing table wherein the focus ring is a continuous ring or is divided into two or more portions; and
a lift pin which is movable in an up-down direction and raises the entirety of or at least a part of the focus ring from the base part,
wherein the focus ring is vertically divided into an upper-side portion and a lower-side portion,
an upper surface of the upper-side portion is divided into two portions, which are a movable portion and a fixed portion, by two straight lines reaching the center of the ring,
the device includes an annular peripheral portion integrated with the placing table,
the annular peripheral portion mounts the focus ring and has a hole in which the lift pin is inserted,
the lift pin inserted in the hole of the peripheral portion is connected to the movable portion of the focus ring, and
an upper surface of the focus ring is located at a height equal to or lower than a height of the placing surface of the placing table when viewed in a cross section, at times other than lift work.

4. The electrostatic chuck device according to claim 3, wherein the peripheral portion has a pair of embankment portions facing each other and extending along a circumferential direction and a groove portion surrounded by the embankment portions, the groove portion has a cooling gas introduction hole, and the focus ring is cooled with a cooling gas flowing through the groove portion.

5. The electrostatic chuck device according to claim 3, wherein at least one of a lower surface of the upper-side portion and an upper surface of the lower-side portion has a groove portion, and
the lower-side portion has a cooling gas introduction hole which introduces a cooling gas into the groove portion, and the introduced cooling gas cools the focus ring.

6. The electrostatic chuck device according to claim 3, wherein an annular protrusion portion is provided on the focus ring, wherein the annular protrusion portion has the same outer diameter as an outer diameter of the focus ring and a larger inner diameter than an inner diameter of the focus ring, and
a height of an upper surface of the protrusion portion approximately coincides with a height of an upper surface of the plate-shaped sample.

7. The electrostatic chuck device according to claim 1, wherein the focus ring has an annular shape in a plan view and has a movable portion as the upper-side portion and a fixed portion as the lower-side portion, which are divided from each other, wherein
the movable portion is moved up or down according to a movement of the lift pin.

8. The electrostatic chuck device according to claim 1, wherein the movable portion and the fixed portion divided from each other are divided by a slope in a circumferential direction.

9. The electrostatic chuck device according to claim 8, wherein
the movable portion has a first surface which is facing downward at an end portion thereof in a circumferential direction, and
the fixed portion has a second surface which is facing upward at an end portion thereof in the circumferential direction, and wherein
the first surface and the second surface face each other in the up-down direction.

10. The electrostatic chuck device according to claim 9, wherein the first surface and the second surface are inclined such that an acute angle which is formed by each of the surfaces and a horizontal plane has an angle of 45° or less with respect to a horizontal direction.

11. The electrostatic chuck device according to claim 1, wherein the focus ring has a mounting surface, which is configured to mount and move the plate-shaped sample according to a rise of the focus ring which is caused by the lift pin, and
the mounting surface is located at a height which is equal to or lower than a height of the placing surface, before the plate-shaped sample is mounted.

12. The electrostatic chuck device according to claim 3, wherein the focus ring has an annular shape in a plan view and has the movable portion and the fixed portion, which are divided from each other, wherein
the movable portion is moved up or down according to a movement of the lift pin, and
the fixed portion is fixed to the base part.

13. The electrostatic chuck device according to claim 3, wherein the movable portion and the fixed portion divided from each other are divided by a slope in a circumferential direction.

14. The electrostatic chuck device according to claim 12, wherein
the movable portion has a first surface which is facing downward at an end portion thereof in a circumferential direction, and
the fixed portion has a second surface which is facing upward at an end portion thereof in the circumferential direction, and wherein
the first surface and the second surface face each other in the up-down direction.

15. The electrostatic chuck device according to claim 14, wherein the first surface and the second surface are inclined such that an acute angle which is formed by each of the surfaces and a horizontal plane has an angle of 45° or less with respect to a horizontal direction.

16. The electrostatic chuck device according to claim 3, wherein the focus ring has a mounting surface, which is configured to mount and move the plate-shaped sample according to a rise of the focus ring which is caused by the lift pin, and
the mounting surface is located at a height which is equal to or lower than a height of the placing surface, before the plate-shaped sample is mounted.

17. The electrostatic chuck device according to claim 3, wherein the focus ring is disposed to have a portion, which overlaps the electrostatic attraction electrode in a plan view, and is attracted by the electrostatic attraction electrode.

\* \* \* \* \*